United States Patent [19]
Shikata

[11] Patent Number: 4,772,489
[45] Date of Patent: Sep. 20, 1988

[54] METHOD OF ANNEALING A COMPOUND SEMICONDUCTOR SUBSTRATE

[75] Inventor: Shinichi Shikata, Osaka, Japan

[73] Assignee: Sumitomo Electric Industries, Ltd., Osaka, Japan

[21] Appl. No.: 909,266

[22] Filed: Sep. 19, 1986

[30] Foreign Application Priority Data

Sep. 20, 1985 [JP] Japan ............................... 60-208310
Aug. 5, 1986 [JP] Japan ............................... 61-184077

[51] Int. Cl.$^4$ .......................................... H01L 21/318
[52] U.S. Cl. ................................... 437/170; 437/171; 437/247
[58] Field of Search ........ 148/187, DIG. 3, DIG. 65, 148/DIG. 84, 1.5; 29/576 B; 204/192; 427/93, 94, 34; 437/170, 171, 247

[56] References Cited

U.S. PATENT DOCUMENTS

| | | | |
|---|---|---|---|
| 4,058,413 | 11/1977 | Welch et al. | 148/DIG. 65 |
| 4,312,681 | 1/1982 | Rupprecht et al. | 148/DIG. 84 |
| 4,357,180 | 11/1982 | Molmar | 148/DIG. 3 |
| 4,396,437 | 8/1983 | Kwok et al. | 148/187 |
| 4,401,054 | 8/1983 | Matsuo et al. | 118/723 |
| 4,415,372 | 11/1983 | Koshimo et al. | 148/187 |
| 4,492,620 | 1/1985 | Matsuo et al. | 204/192.12 |
| 4,543,266 | 9/1985 | Matsuo et al. | 427/275 |
| 4,555,273 | 11/1985 | Collins | 148/1.5 |
| 4,566,940 | 1/1986 | Itsumi et al. | 148/187 |
| 4,576,652 | 3/1986 | Hovel et al. | 148/DIG. 4 |
| 4,615,766 | 10/1986 | Jackson et al. | 148/DIG. 84 |
| 4,642,879 | 2/1987 | Kawata et al. | 148/DIG. 84 |

FOREIGN PATENT DOCUMENTS

| | | | |
|---|---|---|---|
| 0169143 | 9/1985 | Japan | 357/DIG. 65 |
| 86/02488 | 4/1986 | PCT Int'l Appl. | 148/DIG. 65 |
| 0880174 | 7/1984 | U.S.S.R. | 148/DIG. 4 |

OTHER PUBLICATIONS

Low Temperature Chemical Vapor Deposition Method Utilizing an Electron Cyclotron Resonance Plasma; by S. Matsuo and M. Kiuchi; Japanese Journal of Applied Physics, vol. 22, No. 4, Apr., 1983; pp. L210-L212.

Ghandhi, "ULSI Fabrication Principles" John Wiley & Sons, N.Y., pp. 427-429, 1983.

Vauclyamathan, "Study of Encapsulants for Annealing GaAs, J. Electrochem. Society; Solid State Science and Technology, Nov. 77, pp. 1781-1784.

Tandon, "Pused Laser Annealing of Implanted Layers in GaAs Applied Phys. Lett., 34(9), May 1, 1979, pp. 597-599.

Okamura, "ALN Capped Annealing of Si Implanted Semi-Insulating GaAs," Appl. Phys. Letters, 40683, Apr. 15, 82, pp. 689-690.

*Primary Examiner*—George T. Ozaki
*Attorney, Agent, or Firm*—W. G. Fasse; D. H. Kane, Jr.

[57] ABSTRACT

An annealing method for activating ion-implanted layers of a compound semiconductor substrate which comprises a step of converting gas containing prescribed components into plasma through an electron cyclotron resonance process and making the same read with a reactive gas to deposit reaction products onto the surface of the compound semiconductor substrate having the ion-implanted layers thereby forming a protective film; and a step of performing heat treatment for activating the ion-implanted layers. The gas converted into plasma through the electron cyclotron resonance process is $N_2$, $O_2$, $NH_3$ or a gas mixture thereof, preferably $NH_3$.

8 Claims, 2 Drawing Sheets

METHOD OF ANNEALING A COMPOUND SEMICONDUCTOR SUBSTRATE

BACKGROUND OF THE INVENTION

1. Field of the Invention

The present invention relates to a method of annealing a compound semiconductor substrate. More specifically, it relates to a method of annealing a substrate after ion implantation in the process of fabricating a compound semiconductor integrated circuit.

2. Description of the Prior Art

Electronic devices have rapidly matured in recent years with semiconductor devices being as the forerunners. Except for an amorphous semiconductor device which is the most recent of practical semiconductor devices, electronic and optical devices generally have main operational regions, i.e., active regions formed by semiconductor single crystals. A plurality of such active regions are provided in a semiconductor substrate single crystal as regions that differ in electrical and/or optical properties from each other.

In the general method of fabricating an integrated circuit through the use of compound semiconductors, either an epitaxial growth process, a thermal diffusion process, an ion implantation process or the like is employed for forming an active layer, a resistance layer, a contact layer, etc. Of these processes, the ion implantation process is typically employed nowadays since the same is capable of correctly controlling the dose and injected depth of impurities, is operable at room temperature, excellent in uniformity and reproducibility of ion implantation, and short in process time.

The ion implantation process is performed by ionizing target impurity atoms and accelerating the same at an energy of 10 to several hundred KeV to implant the same in a semiconductor substrate, thereby doping the impurities into the semiconductor substrate. However, since the impurity ions are accelerated at such high energy as hereinabove described to be implanted in the substrate crystal, the ion implantation process has various problems to be solved in application to a compound semiconductor single crystal. For example, device characteristics are significantly affected by the type of implanted impurity atoms, deviation in stoichiometry of the crystal after ion implantation, annealing conditions including the type and film quality of a protective film for preventing vaporization of high vapor pressure component atoms, crystal quality of ion-implanted regions and the like.

With an increase in demand for devices operable at very high speed and at high frequency such as a GaAs FET (field-effect transistor) and a GaAs IC (integrated circuit), on the other hand, the ion implantation process has been positively employed as the fabrication technique for such devices. Thus, it is of urgent necessity to solve the aforementioned problems of the ion implantation process.

One of the problems of the ion implantation process is that, ion-implanted regions are degraded in crystallinity since the impurities are accelerated at high energy to be implanted in the substrate crystal, while regions entering amorphous states are increased in case of implanting the impurities in high concentration, whereby heat treatment is required to recover the degraded crystallinity and to substitute impurity atoms into lattice sites to obtain an electrically activated layer. In a general compound semiconductor substrate, however, one kind of component atoms have such high vapor pressure that the same are vaporized from the substrate during the heat treatment, whereby the surface of the substrate is remarkably disturbed in crystallinity (or in composition). As a result, implanted impurity ions cannot be constantly substituted into the substrate crystal to cause variations in electrical properties of devices, leading to a reduced production yield.

In order to solve the aforementioned problems, the following methods are generally employed:

(i) Method of applying a gas pressure: annealing ion-implanted layers in a gaseous atmosphere containing high vapor pressure component atoms of a compound semiconductor, and employing arsine ($AsH_3$) to provide an As pressure atmosphere for a GaAs substrate, for example.

(ii) Method of facing surfaces: bringing an ion-implanted surface of a compound semiconductor substrate to be annealed oppositely into contact with the crystal or crystal powder of compound semiconductor containing high vapor pressure component atoms to anneal the same, thereby preventing vaporization of the high vapor pressure component atoms.

(iii) Protective film method: forming a protective film of silicon nitride, silicon oxide, silicon oxynitride or the like on the ion-implanted surface of a compound semiconductor substrate to be annealed through a CVD process, a sputtering process, a plasma CVD process or the like, to anneal the ion-implanted layers while preventing vaporization of high vapor pressure atoms from the substrate by the protective film.

(iv) Heat treatment through combination of the methods (i) and (iii) or the methods (ii) and (iii).

Method (i) employs an extremely toxic gas such as $AsH_3$ as the atmospheric gas, which is to be diluted by hydrogen or an inactive gas in consideration of safety and workability. Thus, a sufficient vapor pressure cannot be applied and hence vaporization of the high vapor pressure atoms cannot be sufficiently prevented.

Such a problem similarly takes place in method (ii) of facing surfaces, and hence it is difficult to prevent vaporization of the high vapor pressure component atoms from the substrate to be annealed only by the vapor pressure from the crystal or the crystal powder.

Therefore, methods (iii) or (iv) are most generally employed. However, methods (iii) and (iv) both have disadvantages such as that the protective film is inferior in quality and cannot sufficiently prevent vaporization of the high vapor pressure component atoms and that remaining low vapor pressure component atoms are diffused into the protective film.

As hereinabove described, the ion implantation process is indispensable as the process technique for fabricating various devices from compound semiconductor single crystal substrates, but the same has not yet been completely established, with various problems remaining to be solved. Although the aforementioned various methods have been proposed and carried out particularly in heat treatment for recovering crystallinity of regions degraded after ion implantation and for electrically activating implanted ions, the relatively effective methods (iii) and (iv) still have many problems to be solved.

Thus, development of a novel annealing method capable of solving such problems is extremely useful not only for finally obtaining a semiconductor device of high efficiency and high reliability, but for improving the production yield thereof to save costs.

SUMMARY OF THE INVENTION

It is an object of the present invention to provide a method of annealing a compound semiconductor single crystal substrate after ion implantation through a protective film method, which can effectively prevent vaporization of high vapor pressure component atoms while advantageously reducing diffusion of low vapor pressure component atoms into the protective film.

In consideration of the aforementioned circumstances of the methods of heat treatment after ion implantation in compound semiconductor single crystal substrates, the inventors have made a thorough study to improve such heat treatment methods, to find a protective film obtained through the specific method of the invention that is excellent in quality with no disadvantages of the conventional protective film method and that an advantageous result can be obtained through use of such a protective film.

A method of annealing a compound semiconductor substrate according to the present invention is characterized in that a protective film is formed by a thin film forming method utilizing an electron cyclotron resonance ion source on the surface of the ion-implanted compound semiconductor substrate to be annealed, and annealing the same at a temperature for activating atoms implanted through the ion implantation.

The protective film effectively employed in the method according to the present invention may be prepared from arbitrary materials generally employed for this purpose, such as silicon nitride, silicon oxide or silicon oxynitride.

Although this protective film is not particularly restricted in thickness which varies with the materials employed, the same is preferably 100 to 2000 Å in thickness in consideration of a vaporization reducing property of the protective film and an adhesion property to the substrate.

This protective film is formed by a film forming apparatus having an electron cyclotron resonance (ECR) ion source, such as an ECR plasma CVD apparatus described in Japan Applied Physics, vol. 52-2, 1983, pp. 117–119.

After the protective film is thus formed, the compound semiconductor substrate is annealed to activate the implanted ions. The substrate is annealed at a temperature for activating the implanted ions generally within a range of 700° to 1100° C., although the temperature is slightly varied with the types of implanted ions. The heat treatment is performed by means of an electric furnace, a lamp annealing furnace, or the like, preferably in an atmosphere of an unreactive gas such as nitrogen, hydrogen or a gas mixture thereof.

The method of the present invention can be advantageously applied particularly to a compound semiconductor substrate of group III–V compound semiconductor such as GaAs, InAs, GaP, InP, GaSb or InSb.

The conventional ion implantation process for the compound semiconductor single crystal substrates has been particularly disadvantageous in that component atoms of the compound semiconductors such as those of a group V element are vaporized because of high vapor pressure unless appropriate means are applied in heat treatment for activation after ion implantation, whereby the surface of the substrate is remarkably disturbed in crystallinity. As a result, a semiconductor device obtained through such a substrate is extremely inferior in quality, and requires improvement.

Although various means have been proposed to cope with such a problem, none of them can sufficiently solve the problem. For example, a protective film of high quality obtained through a reduced pressure plasma CVD process or a plasma CVD process is still insufficient in structural density and cannot completely prevent vaporization of high vapor pressure atoms, while causing diffusion of low vapor pressure component atoms such as those of a group III element, to degrade crystallinity on the surface of the substrate.

In the method according to the present invention, study has been made to improve a protective film in quality, and it has been found that a film formed by an ECR plasma CVD process or the like is optimally employed for this purpose since the same is excellent in mechanical strength and density. A thin film forming method employing an apparatus having an ECR ion source produces a film of excellent characteristics. According to this method, plasma can be stably generated at a low gas pressure and the ionization factor of the implanted ions can be improved by two or three orders in comparison with the conventional case, while reaction can be facilitated by ion bombardment at an appropriate energy, whereby a dense film can be obtained without damaging the substrate.

In the annealing process according to the method of the present invention, the protective film employed is of high quality with a dense structure and strength in composition with combined hydrogen quantity, whereby vaporization of high vapor pressure component atoms from the substrate and diffusion of low vapor pressure component atoms into the protective film can be efficiently prevented, to effectively and reproducibly recover crystallinity degraded by ion implantation and activate the implanted ions. As a result, various semiconductor devices of high reliability and high efficiency can be obtained from such ion-implanted substrates.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates a comparison of effects of protective films according to the present invention and the conventional method, in which

DESCRIPTION OF THE PREFERRED EMBODIMENTS

Before examples of the present invention are described, a brief description will be made of an ECR plasma CVD apparatus as an example of a film forming apparatus having an electron cyclotron resonance ion source employed to form a protective film according to the present invention. Such an apparatus is described in detail in, e.g., Japan Applied Physics, vol. 52-2, 1983, pp. 117–119 and Japanese Journal of Applied Physics, vol. 22, No. 4, 1983, pp. L210–L212.

This apparatus includes a plasma chamber and a reaction chamber (specimen chamber). The plasma chamber is connected with a microwave waveguide through a wall plate, and is provided at its periphery with an electromagnet. This electromagnet is adapted to set ECR (electron cyclotron resonance) conditions in the plasma chamber with guided microwaves as well as to form a divergent magnetic field for extracting plasma in the specimen chamber.

This plasma chamber is connected with the reaction chamber through a plasma extracting window, so that the plasma is accelerated by the divergent magnetic field and guided to a specimen placed on a specimen table.

According to this apparatus, $N_2$, $O_2$, $NH_3$, gas mixture thereof or the like are introduced into the plasma chamber in which the ECR conditions are set by the microwaves and the magnetic field, so that the plasma gas is induced by the divergent magnetic field to be introduced into the reaction chamber. On the other hand, the reaction chamber contains a substrate placed on the specimen table and is supplied with raw gas for forming a protective film such as $SiH_4$, $Si_2H_6$ or $SiF_4$, which is excited and activated by the plasma to cause a reaction, whereby prescribed reaction products are deposited onto the substrate.

The protective film formed by this ECR plasma CVD process can be removed by a well-known etching process, generally through wet etching employing buffered hydrofluoric acid (BHF). Detailed description is now made of examples of the present invention.

EXAMPLE 1

Figure 1A:
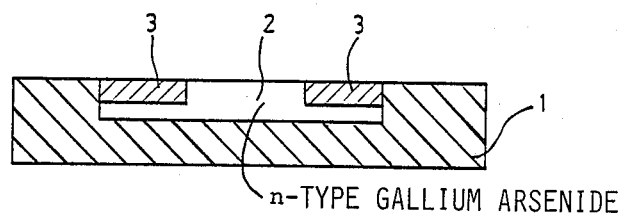
FIGS. 1A to 1D are sectional views showing steps of fabricating a compound semiconductor device with application of the present invention.
Figure 1B:
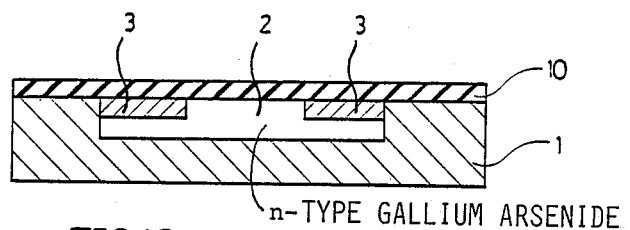
Figure 1C:
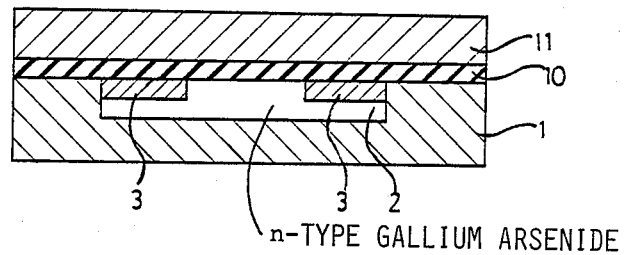
Figure 1D:
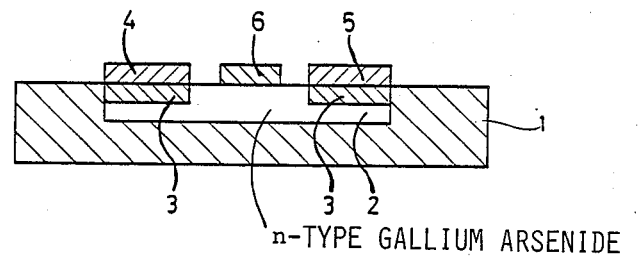

FIGS. 1A to 1D are sectional views showing steps of fabricating a compound semiconductor device as taught by the present invention. In this Example 1, GaAs was employed to prepare a compound semiconductor substrate to be annealed in accordance with the method of the present invention after ion implantation, to fabricate a MES-FET (metal-semiconductor field-effect transistor) with the structure as shown in FIG. 1D. The fabricating method is now described with reference to FIGS. 1A to 1D.

A resist film was formed on the surface of a cleaned and etched GaAs substrate 1 and patterned through photolithography and etching technique to define an ion-implanted layer serving as an active layer. Then 28Si was ion-implanted as impurities at an acceleration energy of 60 KeV in a dose of $2 \times 10^{12}$ cm$^{-2}$ with the patterned resist film employed as a mask, to form an active layer or n-type layer 2 of GaAs. Similar ion implantation was performed at an acceleration energy of 50 KeV in a dose of $2 \times 10^{13}$ cm$^{-2}$ to form a contact layer (n+ layer) 3 of low resistance (FIG. 1A).

Then a silicon nitride film was formed on the ion-implanted surface of the GaAs substrate 1 through a thin film forming apparatus having an electron cyclotron resonance ion source as a protective film 10 for heat treatment. This process was performed by introducing $N_2$ gas of 10 SCCM into the plasma chamber and applying microwaves of 2.45 GHz and a magnetic field of 875 gauss in magnetic flux density to cause electron cyclotron resonance and generate nitrogen plasma. The plasma thus generated was induced to pass into the reaction chamber by means of the divergent magnetic field while 6 SCCM of silane ($SiH_4$) was introduced as reactive gas, to deposit a silicon nitride film of 1400 Å in thickness onto the GaAs substrate 1 (FIG. 1B).

Then the ion-implanted surface of the GaAs substrate 1 was faced against a cleaned and etched surface of another GaAs substrate 11 to be annealed in an electric furnace at 820° C. for 20 minutes in a nitrogen atmosphere, to activate the implanted ions (FIG. 1C).

After the heat treatment, the crystal was partially cracked to obtain a specimen for Auger spectrum analysis. As to the remaining part, the silicon nitride film was removed by hydrofluoric acid to form source and drain electrodes 4 and 5 by Au/Ge/Ni and a gate electrode 6 by Ti/Au through a lift-off method (FIG. 1D).

The gate width of the FET thus obtained was 5 $\mu$m and the source-to-drain distance was 5 $\mu$m. This FET was fabricated at a pitch of 200 $\mu$m, to measure electrical properties. Auger analysis was performed by means of sputtering by argon, to measure distributions of Ga, As, Si and N in the depth direction.

Another FET was similarly fabricated as a reference example by forming a protective film by a gas mixture of $SiH_4$, $NH_3$ and $N_2$ through a general plasma CVD process and annealing the same. The crystal and the FET thus obtained were also subjected to Auger analysis and measurement of electrical properties.

Film forming conditions in the plasma CVD process were a temperature of 300° C. and RF output of 0.26 W/cm$^2$. Other processes were performed in a similar manner to the above.

Figure 2A:
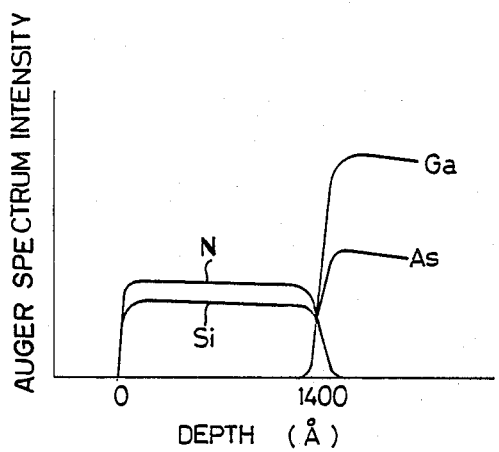
FIG. 2A shows the effect of the protective film according to the present invention and FIG. 2B shows that of the protective film accroding to the conventional method.
Figure 2B:
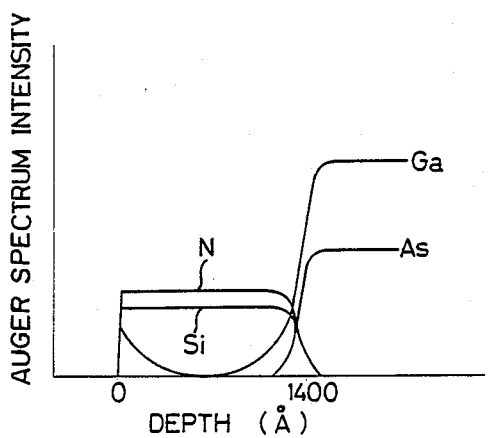

FIG. 2 shows distributions of respective elements in the depth direction through Auger analysis. FIG. 2A shows the result of Auger analysis in the case of the protective film according to the present invention, and FIG. 2B shows that in the case of the conventional protective film.

It can be seen from FIG. 2 that no As was detected in the SiN film formed by the method according to the present invention (see FIG. 2A). Ga and As were detected in the crystal side over a range of 400 to 600 Å into the film and diffused in the film in the prior art example (see FIG. 2B). In the prior art example, Ga was detected in both sides including the surface side, which shows penetration of Ga from the opposite GaAs crystal. Consequently, it may be understood that the protective film of silicon nitride according to the present invention is of a dense structure which is excellently applicable to heat treatment.

Table 1 shows the results of measurement of electrical properties of MES-FETs annealed with protective films formed according to the present invention and the conventional method.

It may be understood from Table 1 that the FET fabricated through the method of the present invention was small in variation of electrical properties, and the crystal was effectively protected.

TABLE 1

|  | Example 1 | Prior Art Example |
|---|---|---|
| mean value of threshold voltage (V) | −0.5 | −0.4 |
| distribution of threshold voltage (mV) | 23 | 35 |
| measured FET number | 17500 | 17350 |

EXAMPLE 2

A protective film was formed by the following method:

15 SCCM of ammonia ($NH_3$) gas was introduced into a plasma chamber and was subjected to microwaves of 2.45 GHz and a magnetic field of 875 gauss in magnetic flux density, thereby causing an electron cyclotron resonance for generating nitrogen plasma. This $N_2$ plasma was introduced into a specimen chamber by means of a divergent magnetic field. On the other hand, 6 SCCM of silane ($SiH_4$) gas was introduced into the specimen chamber as a reactive gas, to deposit a silicon nitride film of 1400 Å in thickness on a GaAs substrate. When $NH_3$ gas is employed to generate $N_2$ plasma, the protective film obtained has smaller flakes and higher density in comparison with that in the case of generating plasma from $N_2$ gas. Furthermore, when employing $NH_3$ gas, film forming parameters can be properly adjusted to form an insulating film excellent in etching resistance in comparison with that formed from $N_2$ gas. In formation of a protective film from $NH_3$ gas, the range of film forming conditions can be widened in comparison with the case of employing $N_2$ gas, whereby film formation can be easily controlled in the process of forming the protective film.

After a protective film of silicon nitride was formed on the GaAs substrate, ion-implanted layers were annealed through a method similar to that of Example 1.

The result of Auger analysis on the protective film and the GaAs substrate after annealing was similar to that shown in FIG. 2A, with no evaporation of high vapor pressure component atoms and no diffusion of low vapor pressure component atoms into the protective film.

According to the method of the present invention as hereinabove described in detail, the protective film for annealing the compound semiconductor substrate is formed by a film forming apparatus having an electron cyclotron resonance ion source, whereby a highly dense film can be obtained to substantially completely prevent vaporization of high vapor pressure component atoms of the crystal substrate and diffusion of low vapor pressure component atoms into the film, thereby allowing effective annealing of the ion-implanted surface without degrading the crystal composition.

A semiconductor element or device obtained by such ion implantation and annealing according to the present invention has excellent electrical properties, while the production yield is greatly improved. Thus, the method according to the present invention is extremely useful as a process technique of fabricating a compound semiconductor device expected to provide a semiconductor device of high efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of annealing a compound semiconductor substrate having ion-implanted layers to serve as active layers in predetermined regions on its surface, said method comprising the steps of converting ammonia ($NH_3$) gas into a nitrogen ($N_2$) plasma through an electron cyclotron resonance process, reacting said nitrogen ($N_2$) plasma with a reactive gas to deposit reaction products onto said compound semiconductor substrate thereby forming a protective film; and performing a heat treatment for activating said ion-implanted layers.

2. The method of annealing a compound semiconductor substrate in accordance with claim 1, wherein said protective film is formed to a thickness in the range of 1000 to 2000 Å.

3. The method of annealing a compound semiconductor substrate in accordance with claim 1, wherein said protective film is formed of a member selected from a group consisting of silicon nitride and silicon oxynitride.

4. The method of annealng a compound semiconductor substrate in accordance with claim 1, wherein said heat treatment is performed in an electric furnace.

5. The method of annealing a compound semiconductor substrate in accordance with claim 1, wherein said heat treatment is performed in a lamp annealing furnace.

6. The method of annealing a compound semiconductor substrate in accordance with claim 1, wherein said heat treatment is performed with the aid of heated facing surfaces.

7. The method of annealing a compound semiconductor substrate in accordance with claim 1, wherein said compound semiconductor substrate is a group III–V compound semiconductor substrate.

8. The method of annealing a compound semiconductor substrate in accordance with claim 7, wherein said group III–V compound semiconductor substrate is selected from the group consisting of GaAs, InAs, GaP, InP, GaSb and InSb.

* * * * *

UNITED STATES PATENT AND TRADEMARK OFFICE
CERTIFICATE OF CORRECTION

PATENT NO. : 4,772,489
DATED : September 20, 1988
INVENTOR(S) : Shinichi Shikata It is certified that error appears in the above-identified patent and that said Letters Patent is hereby corrected as shown below:

In the Abstract [57], line 5, replace "read" by --react--;
Claim 4, line 1, replace "annealng" by --annealing--.

Signed and Sealed this

Seventeenth Day of January, 1989

Attest:

DONALD J. QUIGG

*Attesting Officer*  *Commissioner of Patents and Trademarks*